THIS IS A TEMPORARY NOTICE THAT PATENT # 4,878,745 HAS BEEN ISSUED FOR THE WEEK OF 11-7-89. NEITHER THE PRINTED PATENT NOR THE O.G. NOTICE WAS AVAILABLE AT THE TIME OF SCANNING. THIS NOTICE SHOULD BE REPLACED NEXT WEEK WITH THE PRINTED PATENT, SEE TEXT DATA. PLEASE CALL THE IMAGE DATA ADMINISTRATION STAFF ON 557-6154 IF YOU HAVE A QUESTION. ASK FOR DAVE GROOMS, ANITA YOUNG OR POLA JONES.